United States Patent
Emerick, Jr.

(10) Patent No.: US 6,418,014 B1
(45) Date of Patent: Jul. 9, 2002

(54) ANTI-THEFT LOCKING SYSTEM AND DEVICE FOR ELECTRONIC COMPONENTS

(76) Inventor: John J. Emerick, Jr., 16400 Ledgemont, #305, Addison, TX (US) 75001

(*) Notice: Subject to any disclaimer, the term of this patent is extended or adjusted under 35 U.S.C. 154(b) by 0 days.

(21) Appl. No.: 09/636,158

(22) Filed: Aug. 10, 2000

(51) Int. Cl.[7] .............................................. H05K 7/20
(52) U.S. Cl. .................... 361/686; 361/759; 312/216; 292/148; 70/58
(58) Field of Search ............................... 361/683–686, 361/724–727, 740, 759; 364/708.1; 248/551–553; 312/216, 218; 70/57–58, 85; 272/42, 148, 151

(56) References Cited

U.S. PATENT DOCUMENTS

| | | | |
|---|---|---|---|
| 1,247,137 A | 11/1917 | Muennich | 312/215 |
| 1,264,321 A | 4/1918 | Meyer | 312/219 |
| 1,419,594 A | 6/1922 | Wheary | 312/216 |
| 3,376,479 A | 4/1968 | Wines et al. | 361/740 |
| 3,856,373 A | 12/1974 | Tucich | 312/216 |
| 4,576,423 A | 3/1986 | Hendriks | 312/216 |
| 4,585,202 A * | 4/1986 | Parsekian | 248/553 |
| 4,684,178 A | 8/1987 | Craig | 312/221 |
| D396,795 S | 8/1998 | Francom | D8/339 |
| 5,787,737 A * | 8/1998 | Cho | 70/58 |
| 5,797,487 A | 8/1998 | Young | 206/308.2 |
| 5,873,457 A | 2/1999 | Madweb | 206/301 |
| 5,927,834 A | 7/1999 | Todor | 312/221 |

* cited by examiner

*Primary Examiner*—Darren Schuberg
*Assistant Examiner*—Hung Van Duong
(74) *Attorney, Agent, or Firm*—Cardinal Law Group

(57) ABSTRACT

The invention pertains to an anti-theft locking system that can be applied to a wide variety of electronic components. The locking system incorporates a locking assembly that is installed through a locking passage provided within each electronic component to be protected. The housings of each component and the internal circuitry are provided with the locking passage so that any attempt to remove the locking assembly will result with destruction of the internal components and the housing, making the item attempted to be stolen worthless.

20 Claims, 9 Drawing Sheets

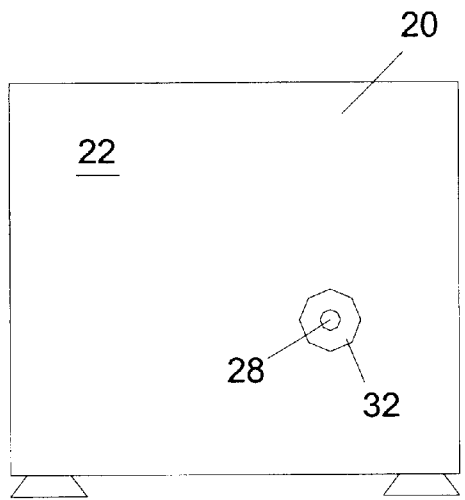
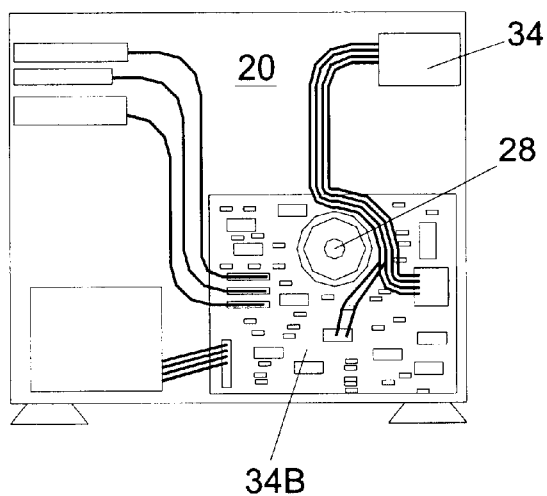
FIG. 2    FIG. 3
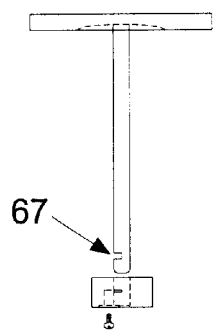
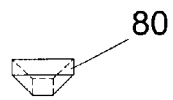
FIG. 4    FIG. 5

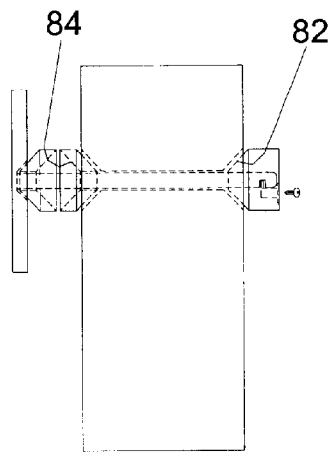
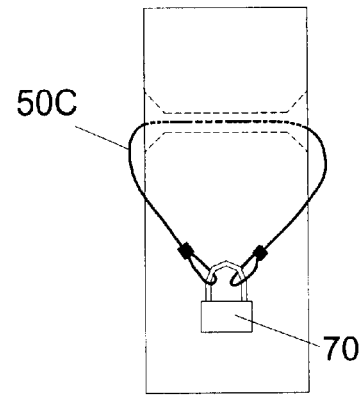
FIG. 6A   FIG. 6B
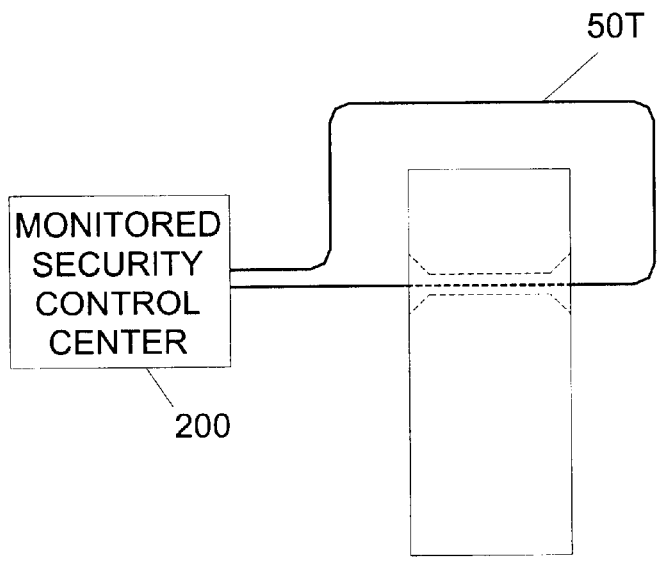
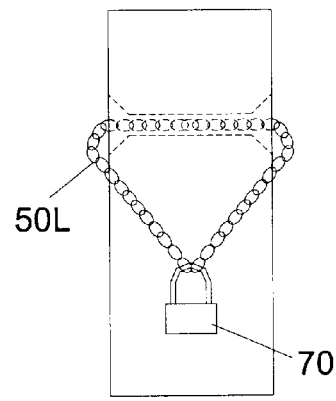
FIG. 6D   FIG. 6C

ANTI-THEFT LOCKING SYSTEM AND DEVICE FOR ELECTRONIC COMPONENTS

BACKGROUND OF THE INVENTION

1. Field of the Invention

The invention pertains to an anti-theft locking device that can be applied to a wide variety of electronic components, and more particularly, is related to an anti-theft locking system which incorporates the locking device and to a method of installation on such equipment. Examples to which the invention pertains, include home video and audio components such as TVs, cable boxes, DSS receivers, VCRs, cassette decks, CD players, amplifiers, etc., automobile electronic components such as audio cassette decks, CD players, amplifiers, etc., home and business electronics such as computers that are either desktop, laptop, or floor-standing versions, printers, scanners, fax machines, and any peripheral external devices such as hard drives, CD Rom drives, and disk drives, and other specialized electronic equipment, such as electronic scientific, testing and measuring equipment like oscilloscopes, Coulter Counters, and medical testing and monitoring equipment. The invention could also be applied to the internal components of computers such as the motherboards, electronic cards, hard drives, disk drives, CD Rom drives, etc. Finally, the invention could even be applied to any other type of electronic equipment that is envisioned to have the physical dimensions which would readily allow the invention to be effective in preventing theft.

2. Discussion of the Prior Art

In today's society, break-ins to homes, cars, offices, businesses, retail stores, boats, and any other place that uses, displays, stores, or warehouses various types and sizes of electronic equipment is common. The dollar value of home-based and work-based electronic devices and equipment can be quite substantial, making such components and devices good candidates for being stolen. Generally, the smaller the size, the more common and the less sophisticated the electronic item, the less expensive it will be on a retail level. Nevertheless, even smaller, common, less sophisticated electronic items can sell anywhere from several hundred dollars to several thousands of dollars. Of course, larger electronic items or specialty items with a higher level of sophistication will generally cost much more. Furthermore, many electronic items being manufactured today have physical size and weight characteristics which allow these items to be easily transported and hidden, making them ideal targets for crime. Since most electronic components perform their functions in isolation, a single device can usually be used by others even when it has been removed from its site of application, also adding to the desirability of stealing such items.

Unfortunately, a truly effective anti-theft mechanism has yet to reach the marketplace for protecting these types of devices. For instance, some anti-theft devices have been designed for specific applications, i.e., laptop computers. A typical laptop anti-theft device uses a flexible cable that is attached to the rear of the unit. While this form of anti-theft device may be a mild deterrent for the unsophisticated thief, it provides only minimal deterrence to a seasoned veteran. This is primarily due to the small diameter of the cables and the superficial means of attaching them to the device housing, both of which a thief can easily cut or forcibly remove from the unit without even damaging the usefulness of the laptop itself. Anti-theft devices for home electronic components have typically comprised a locking means on the front of the cabinet in which such devices are stored. Other locking devices introduced for the same application have applied some sort of latching device that attaches as an external add-on to the unit being protected. However, with either of these types of locking devices, the locking means and latch can be easily destroyed and/or removed, without sacrificing the functionality of the equipment that was supposed to be protected. One specific example of an external type of device consists of a steel loop attached to the backside of a desktop computer, in which the steel loop accommodates a steel cable. These supposedly secure anti-theft devices can be easily cut or the component housing can be physically destroyed so that the loop disconnects from the casing of the computer without realistically damaging the functionality and value of the computer, or the components contained within the computer. Another drawback of such anti-theft devices is that physical size, variations, and intended applications of the locking devices are fairly restrictive, often requiring a flexible cable of a diameter that is no greater than one quarter of an inch.

Moreover, home computers and other types of electronic components are additionally vulnerable. For instance, a home computer will have a variety of internal components that have an incremental value for use in other computers. The destruction of a computer housing will not necessarily destroy the internal components inside the housing, thus these internal components will still provide a separate value to a thief even if he destroys the housing or functionality of the component. Currently, there is no protection widely offered on the market to prevent theft of the internal items either.

In the case of computers or other devices containing electronic data, the primary value in the device is often the value of the data itself, and not the hardware. Access to the internal components of a computer is generally only restricted by a small number of screws which hold the housing together and the internal components in place. This makes it possible to remove data storage components, or copy their contained data, with relative ease, and without leaving any readily visible signs of theft or tampering. Again, there is no protection widely offered on the market to prevent, or even deter, this type of incremental theft, tampering, or copying as related to data storage devices.

In addition to the replacement cost of the electronic item that was stolen, there are also ancillary costs associated with such thefts and often these ancillary costs are quite considerable as well. For example, a vehicle break-in may result in only the loss of a stereo component worth a couple hundred of dollars, but significant additional costs can be incurred for example, for replacing a broken window of the vehicle, repairing the destruction of a door lock, replacing a destroyed dashboard; these are in addition to the higher insurance premiums a person can expect to pay after being the victim of a theft and vandalism of this nature. Similar ancillary costs are also associated with break-ins to homes, offices, retail stores, businesses, and so forth. In the case of computer equipment, significant ancillary costs can also be incurred for the loss of valuable data that was stored in the hard drive or disk drives of the company computer. Very often, the value of this lost data far outweighs the value of the computer itself. Moreover, some data can never be replaced, while other data can take significant amounts of employee time to replicate. Thus, businesses are especially vulnerable to stolen data since their ability to operate may be significantly impacted. Tampering or other unauthorized modification to data or software poses additional risk in this same regard. While many companies do have back-up systems, often enough, the back-up systems are stolen along with the other equipment too. Thus, even the storage back-up systems are vulnerable to theft.

It can be appreciated that based on the above-described problems, there still exists a long-felt need to provide an anti-theft locking system and device for protecting the electronic components of the types mentioned above.

SUMMARY OF THE INVENTION

It is a primary object of the present invention to provide an anti-theft system for protecting electronic equipment, with each component comprising a housing and a plurality of electronic circuitry disposed in the housing, wherein each housing includes a locking passage formed therethrough, with each locking passage being surrounded or giving the appearance of being surrounded by the electronic circuitry, and a locking assembly inserted within the locking passage such that the housings and electronic circuitry are integrated together, or give the appearance of being integrated together, such that forced removal of the locking assembly will significantly damage the electronic circuitry and the housings, or give the appearance of being vulnerable to significant damage.

It is another object of the present invention to provide an anti-theft system which includes an anchoring base, the base including a hole therein, wherein the locking assembly is inserted through the hole of the base, thereby securing the electronic components to the base so as to prevent removal of the components.

It is an aspect of the invention to provide a locking assembly which comprises a lock device and a constraining device, wherein the constraining device is one of an elongate bar, a flexible cable, a chain, or electronic wire for insertion through each locking passage, the constraining device having a pair of ends held together by the lock device, or in the case of an electronic wire, having a pair of ends that are attached to a theft monitoring system.

It is another aspect of the invention to provide a locking assembly which comprises an elongate bar having at least one threaded end and a lock device, wherein the lock device is a female threaded component integral with the base for receiving the threaded end of the bar.

It is another object of the present invention to provide a method of protecting a plurality of electronic components by providing a respective locking passageway in a housing of each electronic component, then inserting a shared locking assembly into each of the locking passageways formed within the respective housings, wherein the locking assembly connects each of components together as a unit.

The features and advantages of the invention will be further understood upon consideration of the following detailed description of an embodiment of the invention taken in conjunction with the drawings, in which:

BRIEF DESCRIPTION OF THE DRAWINGS

FIG. 2 is a side view of the computer shown in FIG. 1, emphasizing that each wall is provided with a locking passage therein;

FIG. 3 is a side view in cross-section taken through line 3—3 of FIG. 1A, emphasizing the location of a hole provided in the printed circuit board;

FIG. 4 is a front view of a locking assembly used in the locking system of the present invention;

FIG. 5 is a side view of an interlocking spacer which can be used with the locking assembly present invention;

FIG. 6A is a plan view of the spacers shown in FIG. 5 being used with the locking device shown in FIG. 4;

FIG. 6B is a plan view of component being secured with a flexible steel cable;

FIG. 6C is a plan view of a component being secured with a chain;

FIG. 6D is a plan view of a component being secured with an electronic wire;

DETAILED DESCRIPTION OF THE PRESENTLY PREFERRED EMBODIMENTS

Figure 1A:
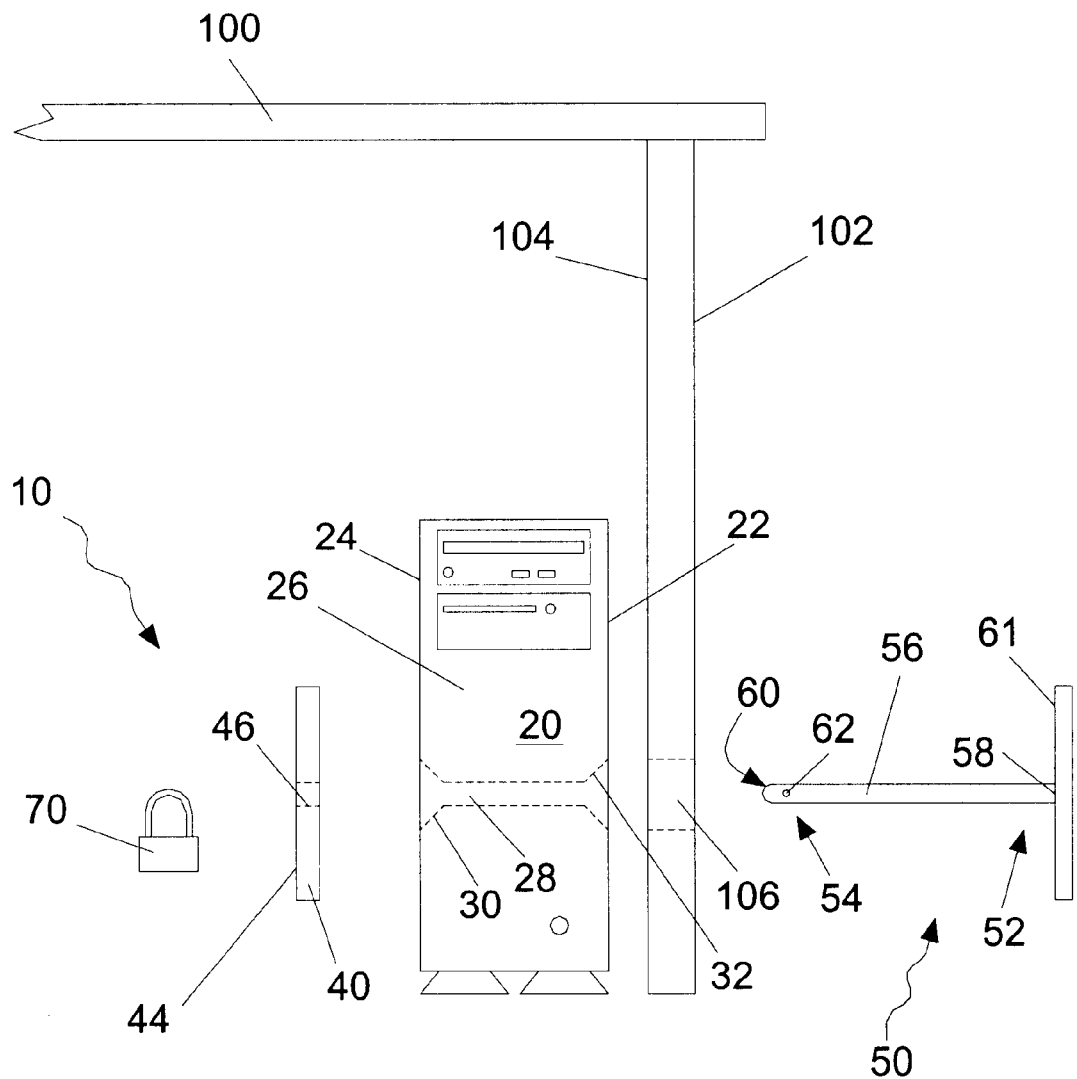
FIG. 1A is a frontal view of the present invention in use with a computer tower that is locked to a heavy object such as a desk.
Figure 1B:
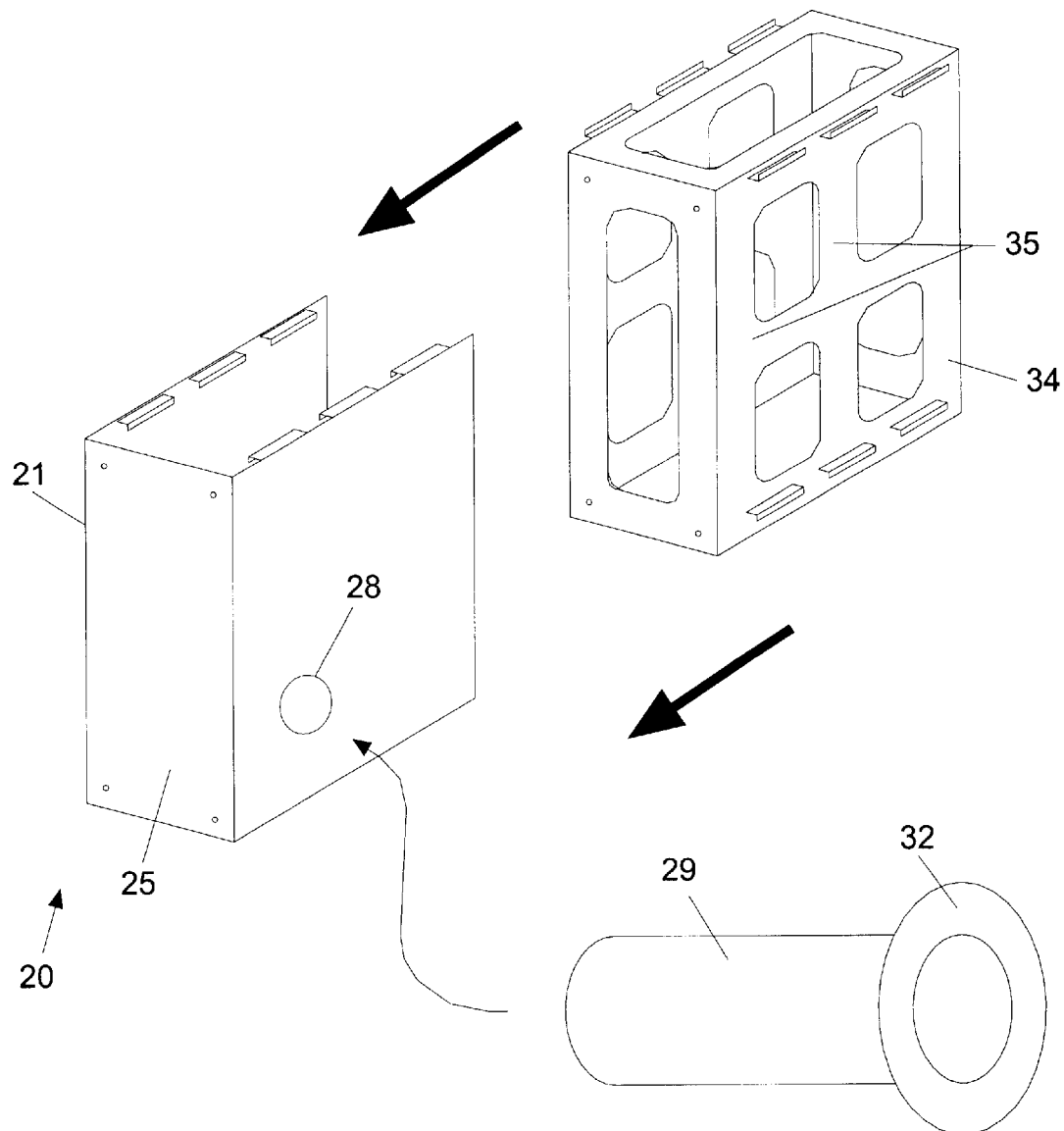
FIG. 1B is an exploded isometric view highlighting the structural construction of the computer tower shown in FIG. 1A.
Figure 10:
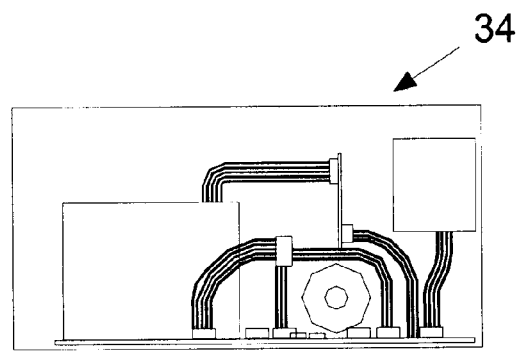
FIG. 10 is a top view highlighting electronic wiring and components being arranged around the hole which accepts the locking system of the present invention.

Turning attention to FIGS. 1–3, a locking system 10 of the present invention will be described in greater detail. In this particular embodiment of the invention, a computer is seen in FIG. 1A illustrated at 20. Only the computer tower is shown, although the invention is applicable to the keyboard and monitor, although they are not shown. The tower includes typical components found on a CPU, therefore they will not be explained in greater detail herein. The construction of the computer tower is shown in FIG. 1B and is seen to include an external housing 21 which includes a first wall 22, a second laterally spaced wall from wall 22 and back wall 25 which interconnects the two side walls. The three walls define the interior space 26. A locking passage 28 extends from first wall 22 through interior space 26, into second wall 24. The locking passage can be formed by merely providing an aligned hole in each wall 22, 24, or it can be formed by first forming the pair of aligned holes as just mentioned, then inserting a tubular sleeve 29 through the holes. Alternatively, the walls 22, 24 may be formed with an inward depression 30 around each of the holes, thereby providing a peripheral female beveled edge 32. In FIG. 1B, it is seen that component 20 also includes the structural framework 34 which supports the housing as well as the internal electronic components. As the heavy arrows show, the framework slides into interior space 26 such that the locking passage 28 will be positioned between the studs 35 forming framework 34. It is emphasized that in this embodiment, the sliding in and out of the framework from the housing is restricted when the component 29 is attached to the housing or when the constraining device is inserted through each of the holes. As best illustrated in FIGS. 3 and 10, the locking passage 28 may preferably extend through the interior space 26 of the computer 20. In FIG. 3, it is emphasized that the locking passage 28 can be formed in a printed circuit board (PCB) with the electronic components 34B in the board being arranged around locking passage 28. In FIG. 10, the emphasis is that the locking passage is formed such that the electrical wiring and internal hardware components 34 are arranged about the locking passage 28.

Figure 7:
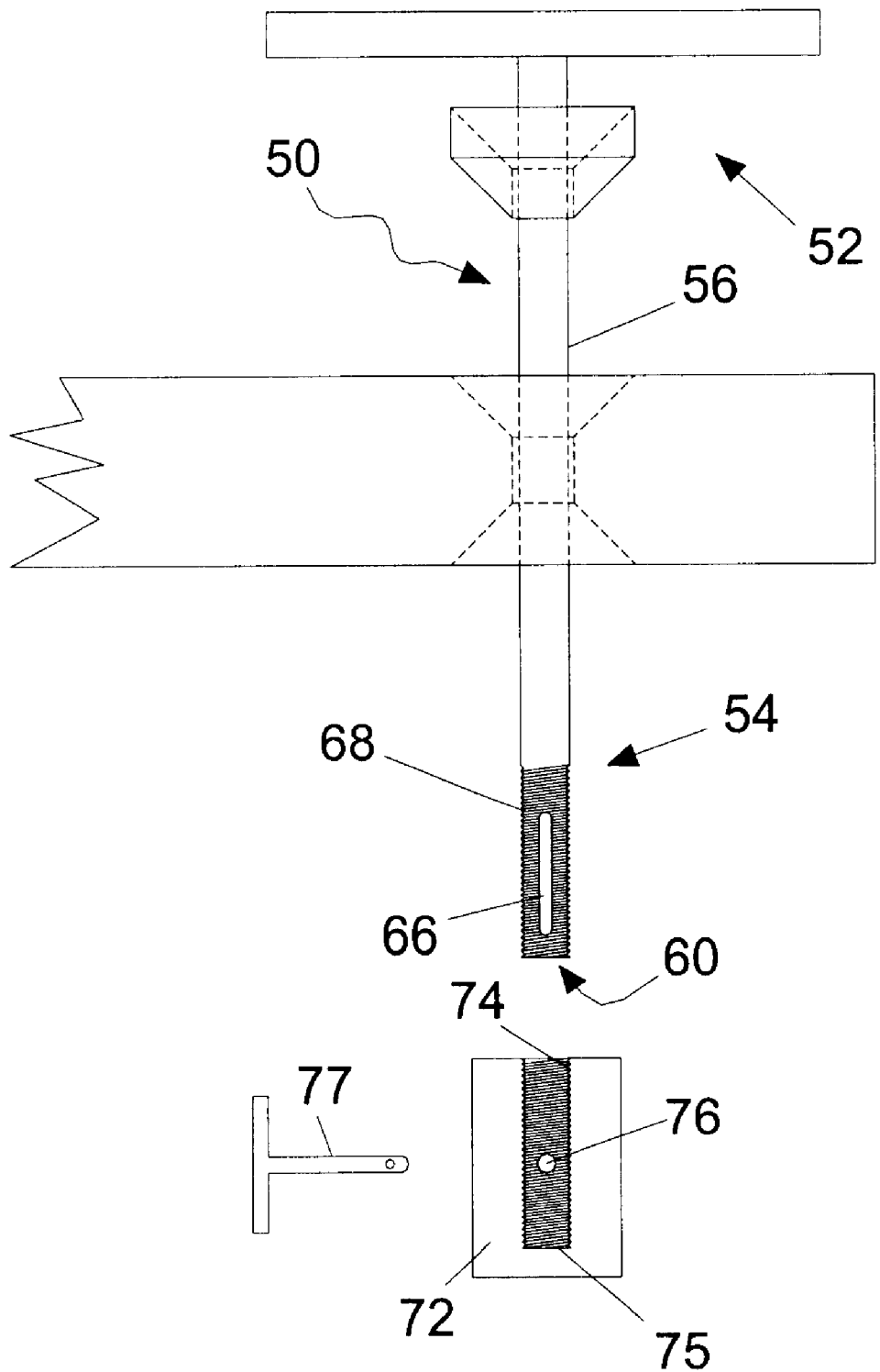
FIG. 7 is a second embodiment of the locking assembly shown in FIG. 4.
Figure 8:
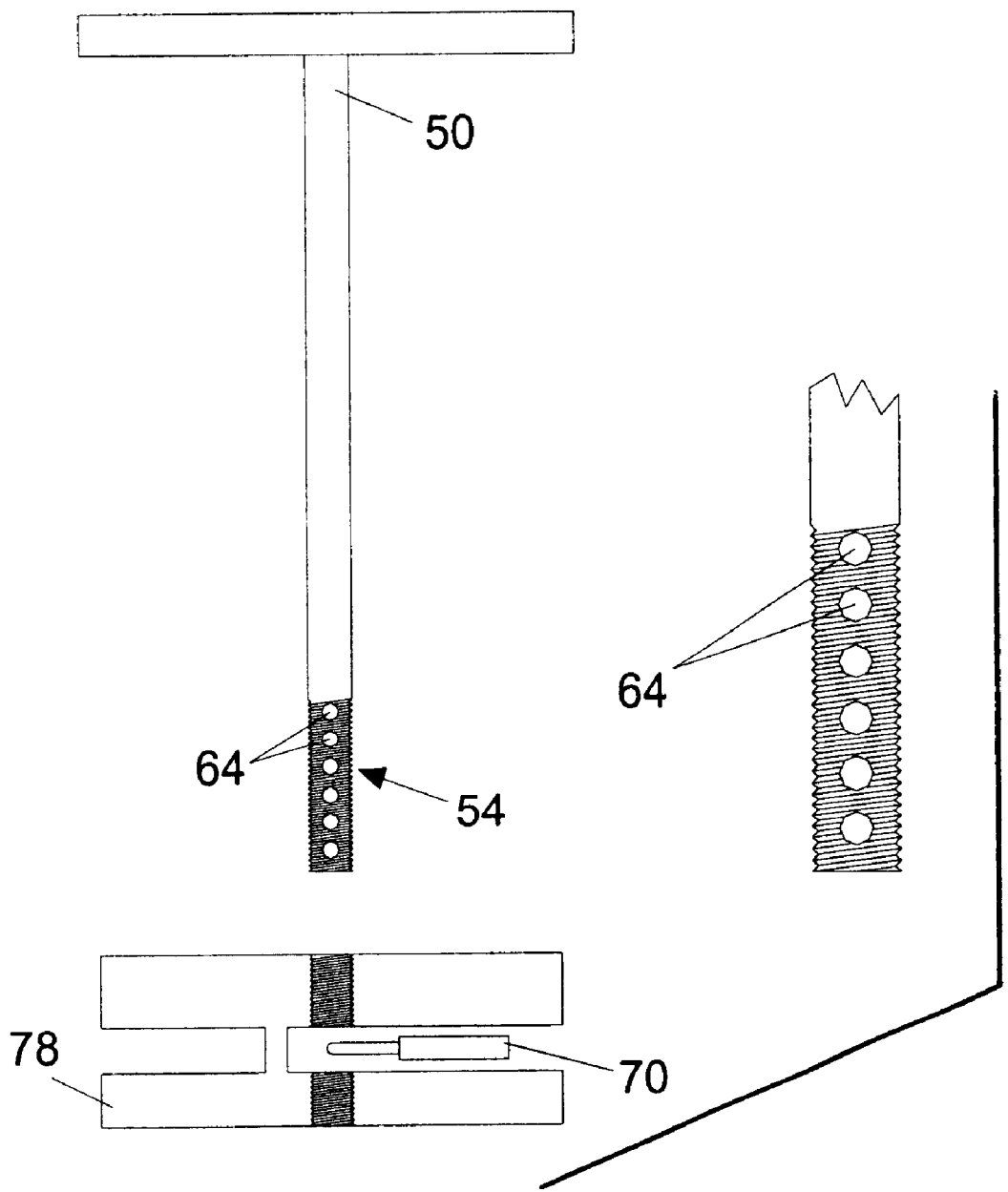
FIG. 8 is another embodiment of the locking assembly shown in FIG. 4.

Another part of the locking system that is shown in FIG. 1A comprises the locking assembly which is formed of at least a constraining device 50, a protection plate 40 and a lock device 70. In this embodiment the constraining device is an elongated locking bar. Other forms of constraining devices will be presented later herein. As illustrated, part of the locking system may also comprise a base unit 100 which in this case is a desk that would be associated with a computer workstation. The desk 100 includes the first wall 102 and the second wall 104 and the hole 106 extending from wall to wall. As should be clear from the FIG. 1 illustration, the hole 106 and the locking passage 28 are aligned on the same axis, as well as the central aperture 46 of protection plate 40. In this way, an elongated locking bar 50 can be inserted through the three holes 106, 28, 46 such that an end 54 of locking bar 50 will project away from the second side surface 44 of protection plate 40. A lock device 70, which in this case is simply a padlock, is then inserted through the single throughbore 62 that is radially directed through the outer surface 56 of bar 50 at the second end 54. The locking bar 50 is shown as a cylindrical rod, although the shape or cross section of the rod should not be considered limiting. The locking bar 50 can be formed in several configurations which are customized to a particular application. For instance, FIG. 7 illustrates that the locking bar 50 can be formed with the second end 54 having an outside threaded surface 68 and with a longitudinal slot 66 instead of the single throughbore 62. Likewise, FIG. 8 illustrates that the second end 54 could also include multiple throughbores 64 which are longitudinally spaced an equal distance from each other and which are arranged to only extend along the same extent as threads 68. The locking bar arrangements illustrated in FIG. 7 and FIG. 8 will be explained in greater detail later herein. The application of the locking system of the present invention described in FIGS. 1–3, illustrates that the locking bar 50 cannot simply be ripped from the computer housing without causing serious damage to the computer component 20 itself, or to the printed circuit board 34B. In FIG. 10, the violent removal of the locking bar would destroy internal wiring and hardware components 34. Furthermore, the fact that the locking system 10 of the invention integrally secures the heavy base unit 100 to the computer component 20, the thought of stealing the computer becomes more onerous to a thief because now he would have to carry the computer 20 and the base unit 100. In the example, the base unit is an office desk, however, any other conceivable base units may be substituted for the desk. For instance, a base unit may comprise a rack for holding a multiplicity of electronic components, or it could be a filing cabinet, or a stationary wall of the office, or another heavy piece of office furniture, etc.

Turning attention to FIGS. 4–6, additional locking assembly components are illustrated. For instance, FIG. 5 shows an interlocking spacer 80 that can be used as shown in FIG. 6A to shield the locking bar 50. Each interlocking spacer is configured such that one of the ends will have a male bevel 82 provided therein, while the other end is provided with a female bevel 84. As best seen in FIG. 6A, the spacers 80 are shaped to complimentarily fit within each other and within the peripheral female beveled edge 32 of the locking passage 28. For that matter, it should be clear that the spacers 80 are designed to complementarily fit within any locking passage formed in any type of electronic device, as long as the locking passage has a similar beveled female edge. The spacer 80 is preferably provided on both ends of the component to be locked so that exposure of the locking bar 50 is minimized. In this way, it would be very difficult for a would-be thief to gain access and cut the locking bar 50. The girth of each interlocking spacer 80 would also make any attempt futile. As FIG. 6A also illustrates, the spacer 80 can also be configured internally as a lock device. The lock device may be similar to the type illustrated in FIG. 4, where the second end 54 of locking bar 50 is provided with a channel 67 that receives the special, locking spacer 80, which would include an internally sliding pin or sleeve that inserts within the channel 67 upon activation by a key. With this arrangement, the second end 54 does not protrude beyond spacer 80. Furthermore, the spacers 80 on the opposite end of the bar protect the bar from potential sawing. Depending upon the actual distance which exists between the electronic component to be protected and the base unit that the component will be attached to with the locking assembly, the spacers provide an ingenious method for bridging that distance such that the bar itself is nowhere exposed. Referring once again to FIG. 1, it is envisioned that the locking passage 28 which is formed in first wall 22 be provided with at least one spacer 80 fitted within the peripheral male beveled edge 32 in order to bridge the spatial difference between wall 22 and wall 104 of the base unit 100, which in this case would be one of the legs of a desk. To further prevent potential sawing or destruction of the locking bar 50, it is seen that the first end 52 of each bar which has been illustrated, is provided with a plate 61 attached to the first end surface 58, preferably by welding. The physical size of the plate would make sawing a futile event, since the entire plate would have to be removed before the rod could be removed. Although FIGS. 4 and 6 illustrate that the second end 54 of locking bar 50 is non-threaded, this end could include external threads for threading engagement with threads internally provided within the central throughbore 46 of the protection plate 40 so that "play" within the locking assembly can be removed. Furthermore, it is envisioned that if locking passage 28 comprised a pre-formed sleeve, as mentioned earlier, the internal surface of the sleeve could be provided with threads (not shown). In this way, if a person were successful in removing a lock device from the locking assembly, he would nevertheless be required to unthread the locking bar 50 from each and every component to which the bar was joined. The extra time to do this could deter a thief.

In FIGS. 7 and 8, a second and third embodiment of the locking bar is illustrated. As shown in FIG. 7, instead of the single passage 62, a longitudinal slot 66 could be provided which would facilitate the alignment with the radial holes 76 provided on the locking cap device 72. It is seen that the locking cap device 72 is provided with an internally threaded blind bore 74 having a bottom end 75. When the locking cap device 72 is threadingly engaged with the locking bar 50, the second end surface 60 contacts against the bottom 75 of blind bore 74. In this way, the slot 66 provides a tolerance so that exact alignment is not required between the slot 66 and radial hole 76. The threaded locking cap device 72 is then provided with a pin 77 through the radial hole 66 wherein one end of the pin 77 can be locked by a typical lock device 70. As FIG. 8 shows, instead of forming a slot 66, the locking bar end may be provided with a plurality of throughbores 64 that are equally spaced from each other and arranged only within the threaded area 68. This embodiment provides a second version of the locking cap 78 which threadingly receives the second end 54 of rod 50 and which internally receives a lock device 70 that is unseen and fully protected from tampering by the lock cap device 78 itself.

It is also envisioned that instead of limiting the locking assembly to using only a rigid locking bar, that component can be alternatively comprise a flexible metal cable, a chain or even a data transmission wire that is connected to an electronic security system. The FIGS. 6B–6D illustrate how these components can be integrated into the locking system of the present invention. In FIG. 6B, it is preferred that the cable 50C be made of steel having a diameter of at least 0.3125 inches to 0.50 inches in diameter. The diameter would be adjusted to the size and type of component being protected. The chain 50L illustrated in FIG. 6C is case hardened and has links which are no wider than 0.50 inches so that the holes and apertures do not become unreasonably large. Finally, the data transmission cable 50T illustrated in FIG. 6D is of a known size and type. The emphasis in this embodiment is not concerned with preventing the cable 50T itself from being cut, but rather is envisioned to break a circuit when it is cut or damaged such that the event creates an alarm state at a remote monitoring and control center 200 where the center effectively acts as the lock device. It should be emphasized that with cable 50C and chain 50L, any exposed end portions can be provided with a plurality of continuously and tightly stacked spacers 80 to prevent or at least deter the attempts to cut the respective constraining devices. Although that arrangement is not shown, it would be analogous to pearls (the spacers would be the pearls) being strung on a string or wire filament.

Figure 9:
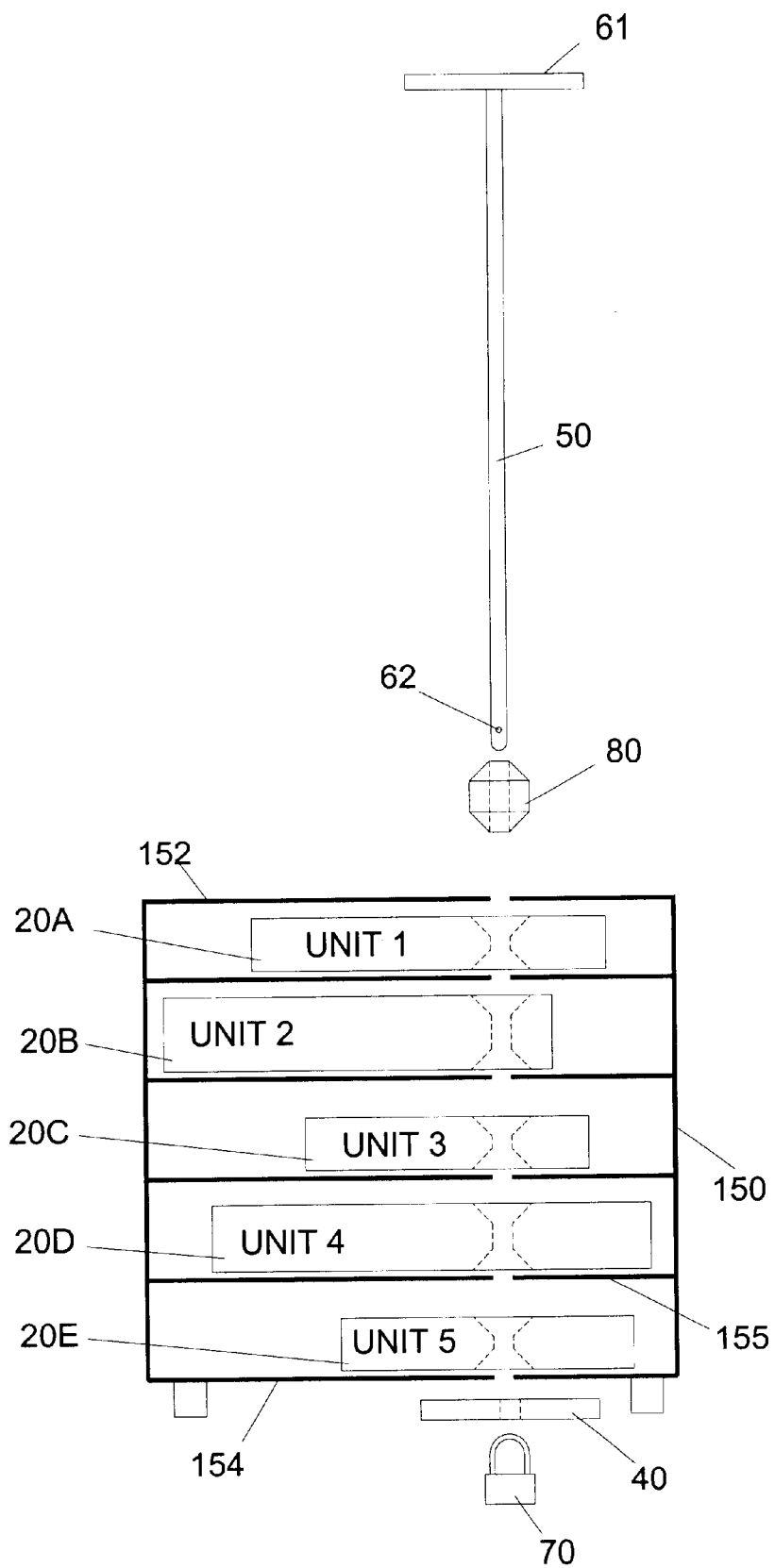
FIG. 9 is a front view of the present invention being applied to a stacked-home stereo unit.

Turning attention to FIG. 9, the locking system 10 of the present invention is illustrated in use with a home stereo unit that has five stacked electronic components 20A–E stored within a cabinet 150. As described with the FIG. 1A embodiment, each electronic component will be provided with a locking passage 28 respectively extending between the component first wall and second wall 22A and 24A, 22B and 24B, etc. Furthermore, each shelf 155A–E which supports a respective electronic component 20A–E, will also be provided with a respective aperture therethrough which allows all electronic components 20A–E, as well as the supporting shelves 155A–E to have their respective locking passages or apertures to be in sufficient vertical alignment with each other such that the housing 150 can receive the locking device 50 through a hole provided in the top wall 152 and in the bottom wall 154. Once the locking device 50 is inserted through each component 20A–E and shelf 155 A–E, the second end 54 of locking bar 50 will first be inserted through the central throughbore 46 of protection plate 40 and then receive a lock device 70 through the radially directed throughbore 62. In this application, a thief could easily see that the cabinet 150 is locked to each electronic component. The thief would have to remove the entire cabinet and all electronic components as a single unit. This would be nearly impossible for the average person to do, and probably extremely difficult even for the strongest thief. Furthermore, the size of the unit as a whole would not facilitate quick, concealed removal.

With any of the devices previously mentioned, it should be understood that not only is the electronic component exterior walls or housing provided with the locking passage 28 but it is also envisioned that each of the electronic components that comprise part of the circuitry have at least some, preferably all of the respective electronic circuitry and even the printed circuit boards (PCB's) be provided with a hole of the same diameter as locking passage 28. The hole in the circuitry and PCB's is referred to as hole 28'. In this way, the electronic circuitry and/or PCBs can be arranged in close approximation to the locking passage 28 so that should a thief attempt to violently disengage the constraining device from the electronic component, the internal circuitry would in most cases be destroyed. This would be especially true when the holes 28' are not aligned to each other or with the locking passages 28 formed in each respective component to be protected. By destroying the housing and the internal circuitry, the thief would be left with nothing of value. Although this may seem to be an extreme methodology for preventing theft, it should be appreciated that once a thief encounters the locking system 10 of the present invention the first or second time, he will thoroughly understand that he will walk away with nothing of value for his efforts, therefore in all probability, he would rather turn away and seek out components which are not locked with the present invention.

Figure 11:
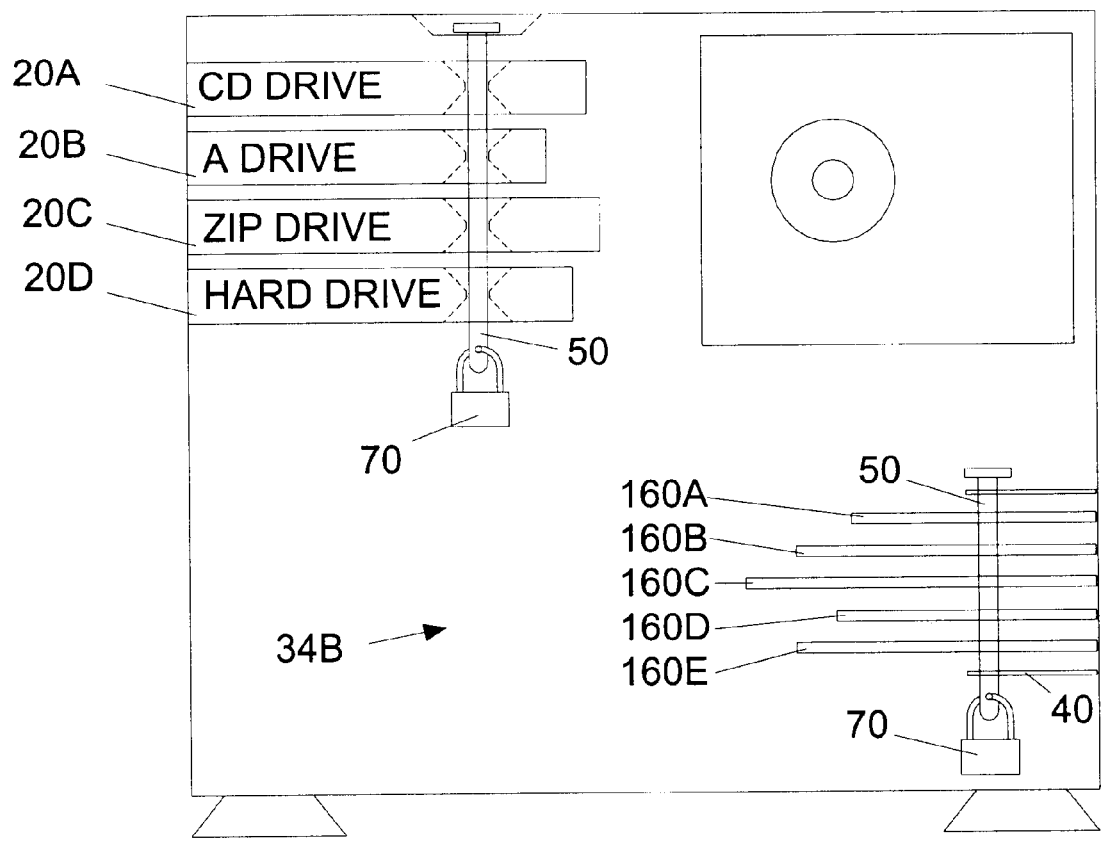
FIG. 11 shows a diagrammatic illustration of the present invention being used to lock a variety of components inside a computer.

For example, in FIG. 11, still another application of the present invention is seen and it is being applied to the internal components 34 which form the computer 20. In this case, the various computer slots have their respective cards 160A–E secured by the locking assembly of the present invention, as illustrated. Furthermore, it is envisioned that the internal devices of the computer such as the hard drive, internal drives, and the various other components 20A–D could be integrally secured together by the locking assembly in a manner as described earlier. In this way, the thief would most likely destroy all of the internal components 34, finding himself with nothing of value. This configuration also inhibits the possibility of tampering with data or of temporarily removing a data storage device for unauthorized purposes.

Figure 12:
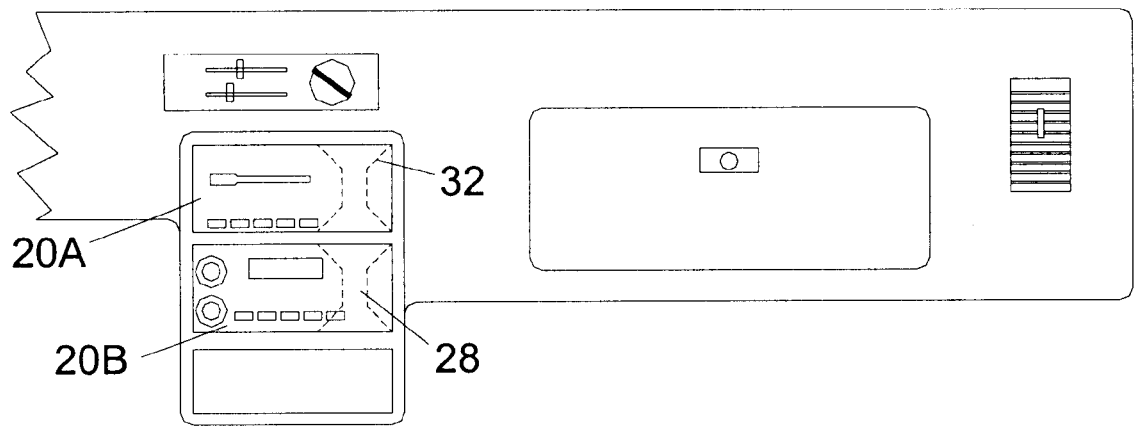
FIG. 12 is a front view of the present invention being applied to a car stereo unit.
Figure 13:
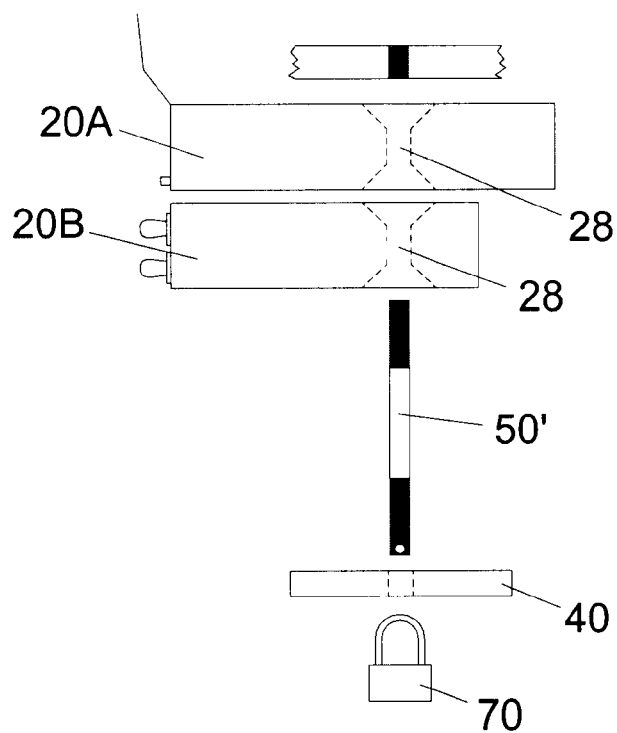
FIG. 13 is an exploded view of the application shown in FIG. 12.

Illustrated in FIGS. 12 and 13 is still another application of the present invention with respect to car stereo unit. The electronic components in this embodiment could be a cassette deck and a tuner, both of which are provided with a locking passage 28 that is vertically aligned with the other. A threaded locking bar 50' could be provided with first and second threaded ends 52', 54'. One of the threaded ends would be inserted through each respective locking passage 28 and threadingly engaged with a female threaded opening provided on a vehicle support located behind the dashboard. Likewise, the other threaded end could receive either a threaded or unthreaded central throughbore 46 of an appropriately sized protection plate 40 prior to providing the threaded locking bar 50' with a simple padlock 70. In this application, the thief would most likely have to destroy the dashboard as well as the components he is seeking to steal prior to being able to remove the electronic components from the vehicle supports.

While the invention has been described with reference to a particular embodiment, those of skill in the art will recognize modifications of structure and arrangement that still fall within the scope of the invention and the following claims.

I claim:

1. An anti-theft system for protecting an electronic device, comprising:
    a housing including a locking passage formed therein; and
    a constraining device positioned in and extending through the locking passage such that force is exerted on at least one electronic component disposed within the housing when removal of the constraining device is attempted, wherein the constraining device is selected from the group consisting of: elongate bar, a flexible cable and a chain.

2. The system of claim 1 wherein the electronic component includes at least one opening formed therein to receive the constraining device.

3. The system of claim 1, wherein the constraining device is inserted through the locking passage to integrate the housing and the electronic component such that forced removal of the constraining device will damage at least one of the housing and the electronic component.

4. The system of claim 1, further comprising:
a lock device attachable to the constraining device.

5. The system of claim 1, wherein the constraining device is an electronic wire, further comprising:
a lock device attachable to the constraining device, the lock device being an electronic security system.

6. The system of claim 1, wherein the constraining device is an elongate bar, the bar having a first end with a first end surface, a second end with a second end surface, and an outside surface extending between the first and second end surfaces, one of the ends of the bar having at least one throughbore formed therein perpendicular to the outside surface and the other of the ends including a plate attached thereto, further comprising:
a lock device securable within the throughbore, wherein the plate and lock device prevent the bar from being pulled through the locking passage.

7. The system of claim 1, further comprising:
a protection plate to protect a portion of the housing surrounding the locking passage; and
at least one spacer nut, the spacer nut for preventing exposure of an end of the constraining device after the constraining device is inserted within the locking passage.

8. The system of claim 1, wherein the housing further comprises:
a first wall having at least one first opening formed therein; and
at least one opposing wall positioned opposite the first wall, the opposing wall having at least one opposing opening formed therein
wherein the first and opposing openings define the locking passage.

9. The system of claim 1, further comprising:
a sleeve positioned adjacent the locking passage to isolate the constraining device from contact with the electronic component.

10. The system of claim 1, wherein the electronic component is a printed circuit board including at least one opening formed therein to receive the constraining device.

11. The system of claim 1, wherein electronic component is a printed circuit board including at least one opening formed therein to receive the constraining device, the opening unaligned with the locking passage.

12. The system of claim 1, further comprising:
an anchoring base attachable to the constraining device.

13. The system of claim 1, wherein the constraining device is an elongate bar, the elongate bar having at least one threaded end, further comprising:
an anchoring base, wherein the threaded end is threadingly insertable into the anchoring base.

14. The system of claim 6, further comprising:
a plurality of throughbores intermittently spaced at an end of the bar of the locking assembly, the throughbores providing adjustability to the constraining device.

15. The system of claim 8, further comprising:
a sleeve positioned between the first opening and the opposing opening to isolate the constraining device from contact with the electronic component.

16. An anti-theft system for protecting an electronic device, the system comprising:
a housing having a locking passage formed therein; and
a locking assembly positioned within the locking passage such that the housing and electronic component are one of integrated together and presenting an external appearance of being integrated together, wherein forced removal the locking assembly will damage at least one of the electronic component and the housing,
wherein the locking assembly comprises a lock device attachable to a constraining device, the constraining device selected from the group consisting of:
an elongate bar, a flexible cable, and a chain.

17. The system of claim 16, wherein the locking assembly comprises an electrical wire connected to the lock device, the lock device being an electrical security system.

18. The system of claim 16, wherein the electronic component is a printed circuit board having a opening formed therein to receive the constraining device.

19. The system of claim 18, wherein the opening formed in the printed circuit board is unaligned with the locking passage.

20. A method of protecting a plurality of electronic components from theft, comprising:
providing a first electronic component having a first locking passage formed therein;
inserting a first locking assembly into the first locking passage;
securing the first locking assembly to an anchoring base;
inserting additional locking assemblies into each additional locking passage formed within each additional electronic component to connect each of the electronic components together as a unit so as to prevent removal of the unit, wherein the first locking assembly comprises a lock device and a constraining device, the constraining device selected from the group consisting of:
an elongate bar, a flexible cable, and a chain.

* * * * *